(12) United States Patent
Yoshinaga et al.

(10) Patent No.: US 6,348,703 B1
(45) Date of Patent: Feb. 19, 2002

(54) EPITAXIAL WAFER FOR INFRARED LIGHT-EMITTING DEVICE AND LIGHT-EMITTING DEVICE USING THE SAME

(75) Inventors: Atsushi Yoshinaga; Junichi Yamamoto, both of Saitama (JP)

(73) Assignee: Showa Denko Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/559,263

(22) Filed: Apr. 27, 2000

Related U.S. Application Data
(60) Provisional application No. 60/159,651, filed on Oct. 18, 1999.

(30) Foreign Application Priority Data

Apr. 27, 1999 (JP) .............................. 11-119689
Sep. 21, 1999 (JP) ........................... 11-266483

(51) Int. Cl.[7] ....................... H01L 31/072; H01L 21/00; H01S 3/30
(52) U.S. Cl. ................... 257/189; 257/196; 257/96; 438/47; 438/930; 372/7; 372/43
(58) Field of Search ............................ 438/46, 47, 930; 257/189, 196, 200, 96; 372/7, 43, 44–48, 75

(56) References Cited

U.S. PATENT DOCUMENTS

| 4,727,555 A | * | 2/1988 | Burnham et al. ............. 372/45 |
| 5,843,802 A | * | 12/1998 | Beernink et al. ............. 438/45 |
| 5,898,192 A | * | 4/1999 | Gerner ........................ 257/98 |

* cited by examiner

Primary Examiner—John F. Niebling
Assistant Examiner—Viktor Simkovic
(74) Attorney, Agent, or Firm—Sughrue Mion, PLLC (57) ABSTRACT

The present invention provides an epitaxial wafer comprising, on a p-type GaAs single-crystal substrate, a first p-type layer; a p-type cladding layer; a p-type active layer; and an n-type cladding layer, wherein the n-type cladding layer has a carrier concentration of $1\times10^{17}$ to $1\times10^{18}$ cm$^{-3}$; a sulfur concentration of $3\times10^{16}$ atoms/cm$^3$ or less; and a thickness of 20–50 $\mu$m. The maximum silicon concentration in the portion of the p-type cladding layer within 2 $\mu$m of the interface between the p-type cladding layer and the first p-type layer is less than $1\times10^{18}$ atoms/cm$^3$; the concentration of carbon, sulfur, or oxygen in the first p-type layer is less than $1\times10^{17}$ atoms/cm$^3$; the p-type cladding layer has a thickness of 50–80 $\mu$m; the first p-type layer has a carrier concentration of $3\times10^{17}$ to $1\times10^{18}$ cm$^{-3}$; and the n-type cladding layer contains germanium at a concentration of $3\times10^{18}$ cm$^{-3}$ or less. Thus, there can be produced an epitaxial wafer for fabricating an infrared LED exhibiting high emitted-light intensity with small variation.

9 Claims, 9 Drawing Sheets

EPITAXIAL WAFER FOR INFRARED LIGHT-EMITTING DEVICE AND LIGHT-EMITTING DEVICE USING THE SAME

CROSS REFERENCE TO RELATED APPLICATION

The present application is filed under 35 U.S.C. §111(a), and claims benefit, pursuant to 35 U.S.C. §119(e)(1), of the filing date of Provisional Application No. 60/159,651 filed Oct. 18, 1999 pursuant to 35 U.S.C. §111(b).

FIELD OF THE INVENTION

The present invention relates to an epitaxial wafer for fabricating a high-intensity infrared light-emitting device which is employed in an optical communications and spatial transmission apparatus using infrared radiation. The invention also relates to an infrared light-emitting device employing the epitaxial wafer and an optical communications and spatial transmission apparatus employing the device.

BACKGROUND ART

Light-emitting devices employing a $Ga_{1-X}Al_XAs$ (wherein $0 \leq X < 1$) (hereinafter abbreviated as GaAlAs) compound semiconductor have been widely used in a light source in a wavelength range from infrared to visible red light. Although an infrared LED is employed in optical communications and spatial transmission, there has been increasing demand for a high-intensity infrared LED of increased capacity for transmitting data and increased transmission distance.

As has conventionally been known, a GaAlAs LED is produced, for example, by forming semiconductor films through epitaxial growth on a GaAs substrate. Such a GaAlAs LED having a double-hetero structure (hereinafter DH structure) exhibits emitted-light intensity higher than that of a GaAlAs LED having a single-hetero structure, and emitted-light intensity is enhanced by means of removing a substrate.

In fabrication of an LED employing a substrate-removed-type structure (hereinafter referred to as a DDH structure), a typical DH structure; i.e., only three layers consisting of a p-type cladding layer, an active layer, and an n-type cladding layer, is epitaxially grown and then a substrate is removed, to thereby reduce the thickness of a produced epitaxial wafer. Such an epitaxial wafer is difficult to handle during processing into a device. In addition, a paste for bonding the device to a conductor migrates through a side face of the device, to thereby disadvantageously short-circuit the pn junction. In order to avoid this problem, a fourth epitaxial layer is added to the DH structure so as to ensure the overall thickness of the substrate-removed and finished epitaxial wafer and the distance from a bottom surface of the device to the junction. This constitution is standard for a DDH structure. The fourth epitaxial layer is designed to have a band gap wider than that of an active layer so as not to absorb emitted light from the active layer. The fourth epitaxial layer may be added on the n-type cladding layer or on the p-type cladding layer of the aforementioned DH structure. In addition, the fourth epitaxial layer may be formed singly or in combination with a plurality of epitaxial layers.

SUMMARY OF THE INVENTION

The present inventors have conducted earnest studies in order to enhance emitted-light intensity of and lower variation in emitted-light intensity of an epitaxial wafer having a DDH structure for fabricating an infrared LED and an infrared LED fabricated from the epitaxial wafer, and have found the following relationships existing during stacking steps for producing an epitaxial wafer comprising a first p-type layer, a p-type cladding layer, a p-type active layer, and an n-type cladding layer.

Specifically, sulfur atoms introduced into the n-type cladding layer lower emitted-light intensity, and the decrease in intensity induced by sulfur atoms in the n-type cladding layer is closely related with the thickness of the n-type cladding layer.

In an initially grown portion of the p-type cladding layer, high-concentration impurities may be segregated at the interface between the p-type cladding layer and the first p-type layer. The segregation lowers emitted-light intensity of the LED and induces variation in emitted-light intensity.

Among the impurities contained in an initially grown portion of the p-type cladding layer, silicon provides the most significant adverse effect. The maximum silicon concentration in the portion of the p-type cladding layer within 2 $\mu$m of the interface between the p-type cladding layer and the first p-type layer is controlled to less than $1 \times 10^{18}$ atoms/cm$^3$, to thereby remarkably enhance emitted-light intensity of the LED and lower variation in emitted-light intensity.

Enhancement of emitted-light intensity of the LED is closely related with the impurity concentrations and the carrier concentration in the first p-type layer. Among the impurities, carbon, sulfur, and oxygen have remarkable adverse effects. When the thickness of the p-type cladding layer is 50–80 $\mu$m; i.e., the optimum range, emitted-light intensity of the LED is enhanced. The first p-type layer preferably has a carrier concentration of $3 \times 10^{17}$ to $1 \times 10^{18}$ cm$^{-3}$.

When Ge is introduced as a dopant into the p-type active layer, a negative correlation is found between Ge concentration in an n-type GaAlAs layer and intensity of emitted light. The present invention has been accomplished on the basis of these findings. Accordingly, the present invention is directed to

[1] an epitaxial wafer for fabricating an infrared light-emitting device, which wafer is produced by sequentially forming on a p-type GaAs single-crystal substrate a first p-type layer ($Ga_{1-X1}Al_{X1}As$, $0.13 \leq X1 \leq 0.40$); a p-type cladding layer ($Ga_{1-X2}Al_{X2}As$, $0.23 \leq X2 \leq 0.46$); a p-type active layer ($Ga_{1-X3}Al_{X3}As$, $0 \leq X3 \leq 0.03$) having an emission wavelength of 850–900 nm; and an n-type cladding layer ($Ga_{1-X4}Al_{X4}As$, $0.13 \leq X4 \leq 0.40$) through liquid-phase epitaxy and removing the p-type GaAs single-crystal substrate, wherein the n-type cladding layer has a carrier concentration of $1 \times 10^{17}$ to $1 \times 10^{18}$ cm$^{-3}$ and a sulfur concentration of $3 \times 10^{16}$ atoms/cm$^3$ or less;

[2] an epitaxial wafer for fabricating an infrared light-emitting device as described in [1], wherein the n-type cladding layer has a thickness of 20–50 $\mu$m;

[3] an epitaxial wafer for fabricating an infrared light-emitting device as described in [1] or [2], wherein the maximum silicon concentration in the portion of the p-type cladding layer within 2 $\mu$m of the interface between the p-type cladding layer and the first p-type layer is less than $1 \times 10^{18}$ atoms/cm$^3$;

[4] an epitaxial wafer for fabricating an infrared light-emitting device as described in [1] or [2], wherein the concentration of carbon, sulfur, or oxygen in the first p-type layer is less than $1 \times 10^{17}$ atoms/cm$^3$;

[5] an epitaxial wafer for fabricating an infrared light-emitting device as described in [1] or [2], wherein the p-type cladding layer has a thickness of 50–80 µm;

[6] an epitaxial wafer for fabricating an infrared light-emitting device as described in [1] or [2], wherein the first p-type layer has a carrier concentration of $3 \times 10^{17}$ to $1 \times 10^{18}$ cm$^{-3}$;

[7] an epitaxial wafer for fabricating an infrared light-emitting device as described in [1] or [2], wherein the p-type active layer contains germanium as a predominant impurity and the n-type cladding layer contains germanium at a concentration of $3 \times 10^{18}$ cm$^{-3}$ or less;

[8] a light-emitting device fabricated by use of an epitaxial wafer for fabricating an infrared light-emitting device as recited in [1] or [2]; and

[9] an optical communications and spatial transmission apparatus employing a light-emitting device as recited in [8].

DETAILED DESCRIPTION OF THE INVENTION

Figure 1:
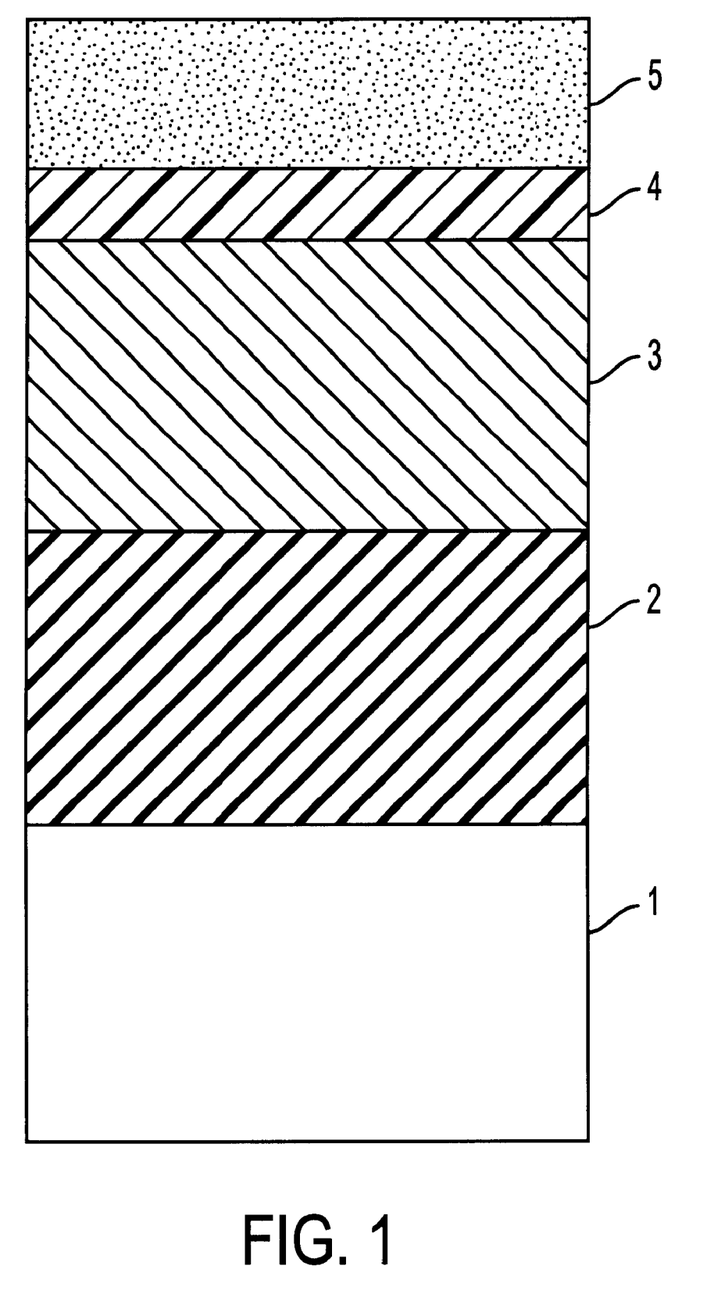
FIG. 1 shows the structure of the LED according to the present invention.

The present invention provides an epitaxial wafer for fabricating an infrared LED as shown in FIG. 1, which wafer is produced by sequentially forming on a p-type GaAs single-crystal substrate 1 a first p-type layer ($Ga_{1-X1}Al_{X2}As$, $0.13 \leq X1 \leq 0.40$) 2; a p-type cladding layer ($Ga_{1-X2}Al_{X2}As$, $0.23 \leq X2 \leq 0.46$) 3; a p-type active layer ($Ga_{1-X3}Al_{X3}As$, $0 \leq X3 \leq 0.03$) 4 having an emission wavelength of 850–900 nm; and an n-type cladding layer ($Ga_{1-X4}Al_{X4}As$, $0.13 \leq X4 \leq 0.40$) 5 through liquid-phase epitaxy and removing the p-type GaAs single-crystal substrate 1.

In the present invention, the n-type cladding layer has a carrier concentration of $1 \times 10^{17}$ to $1 \times 10^{18}$ cm$^{-3}$, preferably $2 \times 10^{17}$ cm$^{-3}$ to $6 \times 10^{17}$ cm$^{-3}$, and a sulfur concentration of $3 \times 10^{16}$ cm$^{-3}$ or less, preferably $1 \times 10^{16}$ cm$^{-3}$ or less.

The present inventors have found a relationship between sulfur concentration or carrier concentration in the n-type cladding layer and intensity of emitted light of an LED, and have also found that emitted-light intensity can be enhanced by adjusting the sulfur concentration and the carrier concentration such that they fall within the aforementioned ranges. The supposed reason is that sulfur incorporated into the n-type cladding layer relates to formation of non-radiative recombination centers depending on the carrier concentration.

Although sulfur per se is not intentionally added to the n-type cladding layer, sulfur is readily incorporated as an impurity into the system in a growth apparatus during liquid-phase epitaxy. Possible sources for incorporation of sulfur into the system in the growth apparatus are impurities contained in epitaxial growth sources and atmosphere gases and deposits in the growth apparatus. In order to prevent incorporation of these impurities, a GaAs single-crystal substrate for epitaxial growth and GaAs polycrystals are pre-treated with a high-purity etchant, and the etched matter is sufficiently washed with ultrapure water and optionally subjected to ultrasonic treatment. In addition, commercially available high-purity gases such as hydrogen and argon are employed as gases serving as an atmosphere of epitaxial growth, the purity of these gases being further enhanced by means of a gas-purifying apparatus.

Figure 2:
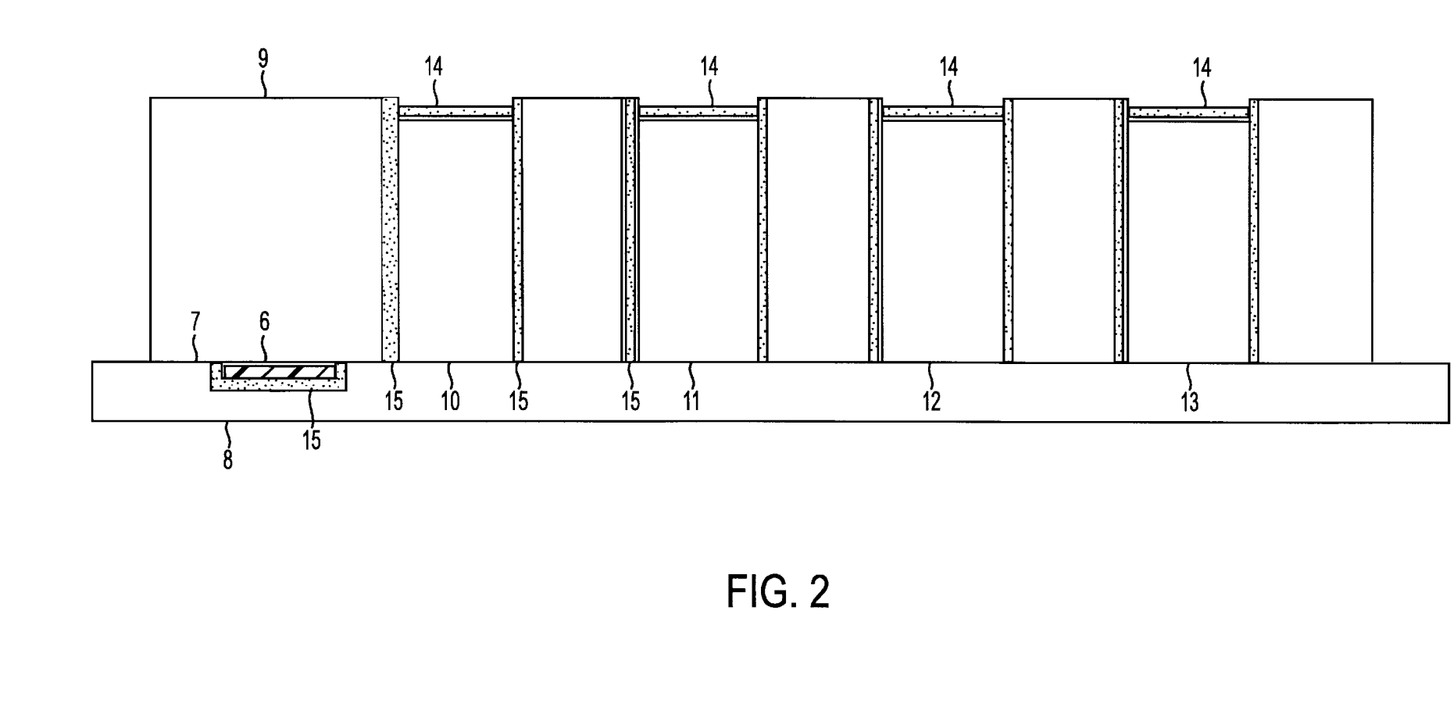
FIG. 2 is a schematic view of a slide boat film-forming apparatus employed for carrying out the present invention.

The sulfur concentration in the n-type cladding layer is effectively lowered by firing an epitaxial growth apparatus in a hydrochloric gas atmosphere at approximately 1400° C. for one hour prior to epitaxial growth. The firing treatment is considered to purify graphite material employed in many parts of the epitaxial growth apparatus, to thereby effectively remove deposits such as sulfur. The term "epitaxial growth apparatus" used herein refers to the entirety of the apparatus that is surrounded by an atmosphere gas employed during growth. For example, the entirety of the apparatus shown in FIG. 2 is referred to as the epitaxial growth apparatus.

When the n-type cladding layer of the present invention has a sulfur concentration of $3 \times 10^{16}$ cm$^{-3}$ or less and a carrier concentration in excess of $1 \times 10^{18}$ cm$^{-3}$, defects induced by dopants increase and intensity of emitted light decreases, whereas when the n-type cladding has a sulfur concentration of $3 \times 10^{16}$ cm$^{-3}$ or less and a carrier concentration of less than $1 \times 10^{18}$ cm$^{-3}$, the forward voltage increases, to thereby fail to satisfy characteristics required for LEDs.

In the present invention, the n-type cladding layer preferably has a thickness of 20–50 µm. A small thickness is preferred for the n-type cladding layer, in view of low absorption of light from the active layer. However, when the thickness is less than 20 µm, electric current flowing from a surface electrode does not expand to a peripheral portion of a device and remains in a central portion, to thereby provide a device exhibiting a low emitted-light intensity and deterioration due to passage of electricity. When the thickness is more than 50 µm, absorption of emitted light increases, thereby lowering intensity of emitted light. Thus, the n-type cladding layer preferably has a thickness of 20–50 µm, more preferably 30–40 µm, so as to produce a high-intensity infrared LED.

In the present invention, the maximum silicon concentration in the portion of the p-type cladding layer within 2 µm of the interface between the p-type cladding layer and the first p-type layer is preferably less than $1 \times 10^{18}$ atoms/cm$^{3}$.

Even though the cooling rate is constant in an initially grown portion of the p-type cladding layer, the supersaturation degree of the melt can be varied, to thereby provide a variable growth rate. The present inventors have found that high-concentration impurities may be segregated at the interface between the p-type cladding layer and the first p-type layer and that the segregation lowers emitted-light intensity of the LED and induces variation in emitted-light intensity. The inventors have performed further studies on the aforementioned impurities, and have found that, among the impurities, silicon provides the most significant adverse effect, and that controlling the maximum silicon concentration in the interface portion to less than $1 \times 10^{18}$ atoms/cm$^3$ remarkably enhances emitted-light intensity of the LED and lowers variation in emitted-light intensity.

The present inventors have also found that enhancement of emitted-light intensity of the LED is closely related with the impurity concentrations and the carrier concentration in the first p-type layer, and that, among the impurities, carbon, sulfur, and oxygen have remarkable adverse effects. The concentration of each impurity is preferably less than $1 \times 10^{17}$ atoms/cm$^3$.

The present inventors have also found that the p-type cladding layer of the aforementioned infrared light-emitting device of a DDH structure has an optimum thickness range of 50–80 $\mu$m, and emitted-light intensity of the LED is enhanced by selecting the range. The inventors have found that the first p-type layer preferably has a carrier concentration of less than $1 \times 10^{18}$ cm$^{-3}$, more preferably $3 \times 10^{17}$ cm$^{-3}$ or more so as to regulate the forward voltage (VF) to less than 2.1 V during operation at 200 mA for a 350 $\mu$m×350 $\mu$m LED.

Preferably, in the present invention, the p-type active layer contains germanium as a predominant impurity, and the germanium concentration in the n-type cladding layer is $3 \times 10^{18}$ atoms/cm$^3$ or less.

Although Ge is employed as an impurity in the p-type active layer, Ge is not intentionally added to the n-type layer. Therefore, possible pathways may be migration of a Ge-containing Ga solution for growing the p-type active layer into a Ga solution for growing the n-type layer during epitaxial growth, and diffusion of Ge from the Ge-containing Ga solution for growing the p-type active layer to the Ga solution for growing the n-type layer.

Liquid-phase or gas phase epitaxy may be employed in a method for growing the aforementioned epitaxial wafer. Particularly, there is preferably employed liquid-phase epitaxy with gradually lowering temperature by means of a slide boat as shown in FIG. 2.

The present invention will be described in more detail in reference with FIG. 2. A p-type GaAs substrate 6 is set in a substrate-holding cavity 7 disposed in a slider 8. In a slide boat 9 are disposed four crucibles 10 to 13; i.e., crucibles equal in number to the layers to be epitaxially grown. In each crucible are placed metallic Ga, metallic Al, and polycrystalline GaAs in a composition suitable for growth an epitaxial layer, and a dopant suitable for attaining the conduction type and the carrier concentration in each epitaxial layer.

In practice, firstly, the slide boat shown in FIG. 2 is set in a quartz-made reaction tube and heated under hydrogen flow, to thereby melt raw materials. The slider 8 is moved rightward to a position under a crucible 10, to thereby bring the p-type GaAs substrate into contact with the melt. Subsequently, the temperature of the atmosphere is lowered, to thereby grow on the p-type GaAs substrate a first p-type GaAlAs layer as shown in FIG. 1. Movement of the slider and lowering of the temperature are repeated in a similar manner, to thereby grow four epitaxial layers corresponding to those shown in FIG. 1.

In order to lower sulfur concentration and Ge concentration in the n-type cladding layer, inner surfaces of the substrate-holding cavity 7 and crucibles 10 to 13 in the slide boat jig shown in FIG. 2 are coated with glassy carbon. In another aspect, wettability to a Ga solution is reduced by coating with glassy carbon 15 surfaces coming into direct contact with the Ga solution, to thereby prevent migration of the Ge-containing Ga solution for growing the p-type active layer into the Ga solution for growing the n-type layer during epitaxial growth.

Furthermore, crucible caps are formed from glassy carbon. These crucible caps per se are employed so as to prevent migration of vapor of other crucibles into one crucible. When the crucibles are formed from glassy carbon of low porosity, migration of unintentional impurities can be prevented.

Each of the sulfur concentration and Ge concentration in a conventional n-type epitaxial layer is $5 \times 10^{16}$ cm$^{-3}$ or more. However, the aforementioned manner is employed to thereby control the concentration to $3 \times 10^{16}$ cm$^{-3}$ or less. When each of sulfur concentration and Ge concentration is controlled to $3 \times 10^{16}$ cm$^{-3}$ or less, emitted-light intensity of a high-speed, high-intensity infrared light-emitting device of a DH structure can be elevated as compared with the case of conventional LEDs.

In order to control the maximum silicon concentration in the portion of the p-type cladding layer within 2 $\mu$m of the interface between the p-type cladding layer and the first p-type layer to less than $1 \times 10^{18}$ atoms/cm$^3$, more preferably less than $4 \times 10^{17}$ atoms/cm$^3$, particularly preferably less than $1 \times 10^{17}$ atoms/cm$^3$, the cooling rate of the portion during epitaxial growth is lowered, to thereby provide a constant degree of supersaturation. Thus, segregation of silicon at the interface portion can be prevented. The formation of the crucible caps 14 shown in FIG. 2 from glassy carbon of low porosity is also effective. During film formation, the quartz-made reaction tube is reduced by hydrogen to form silicon suboxide or silicon. When the porosity of a crucible cap is lowered, migration of silicon sources into a melt can be prevented.

The firing of a growth apparatus at the time of placement of a substrate and raw materials so as to prevent adsorption of sulfur oxide and carbon dioxide on sliding boat parts is effective in controlling the concentration of carbon, sulfur, or oxygen contained in the aforementioned first p-type layer to less than $1 \times 10^{17}$ atoms/cm$^3$. In addition, the coating of the inner surfaces of the substrate-holding cavity 7 and the crucibles 10 to 13 with glassy carbon is also effective.

After completion of epitaxial growth, the epitaxial wafer is removed to fabricate a device. In practice, the surface of an n-type cladding layer 5 shown in FIG. 1 is coated with an acid-resistant sheet, and the GaAs substrate is selectively removed through etching by use of an ammonia-hydrogen peroxide etchant. Subsequently, a gold electrode is formed in each surface of the epitaxial wafer, and elements are isolated through dicing, to thereby fabricate a device.

Since the infrared LED according to the present invention exhibits high intensity of emitted light, the LED is particularly preferably employed in a light-emitting device incorporated into an optical communications and spatial transmission device using infrared radiation. Optical communications and spatial transmission devices employing the infrared LED of the present invention are suitable for transmitting data of large volume over a long distance.

BEST MODES FOR CARRYING OUT THE INVENTION

The present invention will next be described in more detail by way of examples and comparative examples, which should not be construed as limiting the invention thereto.

EXAMPLE 1

Epitaxial growth was carried out through liquid-phase epitaxy employing a slide boat as shown in FIG. 2. In each of crucibles 10 to 13 were placed metallic Ga, metallic Al, and polycrystalline GaAs in a composition suitable for growth of an epitaxial layer, and a dopant suitable for attaining the conduction type and the carrier concentration in each epitaxial layer. Specifically, Zn was added to the crucible 10 for growing the first p-type layer and the crucible 11 for growing the p-type cladding layer; Ge was added to the crucible 12 for growing the p-type active layer; and Te was added to the crucible 13 for growing the n-type cladding layer.

In order to reduce the amounts of impurities; i.e., carbon, sulfur, oxygen, and Ge, incorporated into epitaxial layers, inner surfaces of the substrate-holding cavity 7 and crucibles 10 to 13 in the slide boat jig 2 were coated with glassy carbon. The crucible caps 14 were formed from glassy carbon of low porosity so as to prevent migration of silicon released from the quartz-made reaction tube.

Prior to epitaxial growth, the epitaxial growth apparatus was fired in hydrochloric acid gas at approximately 1400° C. for one hour.

In addition, a GaAs single-crystal substrate for epitaxial growth and GaAs polycrystals were etched with a high-purity etchant, and the etched matter was subjected to ultrasonic treatment by use of ultrapure water. Commercially available high-purity gases such as hydrogen and argon were employed as gases serving as an atmosphere of epitaxial growth, the purity of these gases being further enhanced by means of a gas-purifying apparatus.

In practice, epitaxial growth was carried out in the following manner. Firstly, the slide boat shown in FIG. 2 was set in a quartz-made reaction tube and heated at 950° C. under hydrogen flow, to thereby melt raw materials. Subsequently, the temperature of the atmosphere was lowered to 920° C., and the slider 8 was moved rightward to a position under the crucible 10, to thereby bring the p-type GaAs substrate 6 into contact with the melt. Then, the temperature of the atmosphere was lowered initially at 0.2° C./minute for ten minutes and subsequently at 0.5° C./minute, to thereby grow on the p-type GaAs substrate a first p-type GaAlAs layer as shown in FIG. 1. Movement of the slider and lowering of the temperature were repeated in a similar manner, to thereby grow four epitaxial layers corresponding to those shown in FIG. 1. When growth of epitaxial layers other than the p-type active layer was carried out, the temperature of the atmosphere was lowered initially at 0.2° C./minute for ten minutes and subsequently at 0.5° C./minute as in the case in which the first p-type GaAlAs layer was formed.

Through employment of such a temperature lowering pattern, sudden deposition in a portion in the vicinity of an interface between epitaxial layers was mitigated, thereby preventing deposition of silicon at high concentration. When the p-type active layer was grown, the temperature of the atmosphere was lowered at 0.2° C./minute during growth with a growth temperature range of 2° C.

Through the method as described above, film formation were carried out for several batches. The amounts of metallic Ga, metallic Al, GaAs polycrystals, and dopants which were placed in the crucibles 10 to 13 were slightly modified within the scope of the present invention.

After epitaxial growth was completed, the compositional proportions, carrier concentration, and thickness of each layer were measured. The compositional proportions of the first p-type layer $Ga_{1-X1}Al_{X1}As$ was found to be $0.13 \leq X1 \leq 0.40$); the p-type cladding layer $Ga_{1-X2}Al_{X2}As$ $0.23 \leq X2 \leq 0.45$; the p-type active layer $Ga_{1-X3}Al_{X3}As$ X3=0.01; and the n-type cladding layer $Ga_{1-X4}Al_{X4}As$ $0.14 \leq X4 \leq 0.40$. Since each layer was grown through a slow cooling method, the Al compositional proportion in each epitaxial layer other than the p-type active layer decreased in a direction toward the device surface, and the compositional proportions of each layer varied within a certain range. The average carrier concentrations of the first p-type layer, p-type cladding layer, p-type active layer, and n-type cladding layer were found to be $1 \times 10^{18}$ cm$^{-3}$, $5 \times 10^{17}$ cm$^{-3}$, $2 \times 10^{18}$ cm$^{-3}$, and $1 \times 10^{17}$ to $1 \times 10^{18}$ cm$^{-3}$, respectively. The thicknesses of the first p-type layer, p-type cladding layer, p-type active layer, and n-type cladding layer were found to be 80 µm, 70 µm, 0.5 µm, and 40 µm, respectively.

A light-emitting device was fabricated by use of the epitaxial wafer. In practice, the surface of the n-type GaAlAs layer 5 shown in FIG. 1 was coated with an acid-resistant sheet, and the GaAs substrate was selectively removed through etching by use of an ammonia-hydrogen peroxide etchant. After the acid-resistant sheet was removed, a gold electrode was formed in each surface of the epitaxial wafer, and elements were isolated through dicing, to thereby fabricate an infrared LED.

EXAMPLE 2

The procedure of Example 1 was repeated, except that the growth rate of each epitaxial layer from the initiation to the completion of growth was set to be 0.5° C./minute, to thereby fabricate an LED.

EXAMPLE 3

The procedure of Example 1 was repeated, except that the growth rate of each epitaxial layer from the initiation to the completion of growth was set to be 1.0° C./minute, to thereby fabricate an LED.

Comparative Example 1

The rate of cooling the atmosphere during epitaxial growth was set to be 1.0° C./minute, as in Example 3. The procedure of Example 1 was repeated, except that the material of the crucible caps 14 shown in the aforementioned FIG. 2 was changed from glassy carbon to customary graphite, to thereby fabricate an LED.

Figure 3:
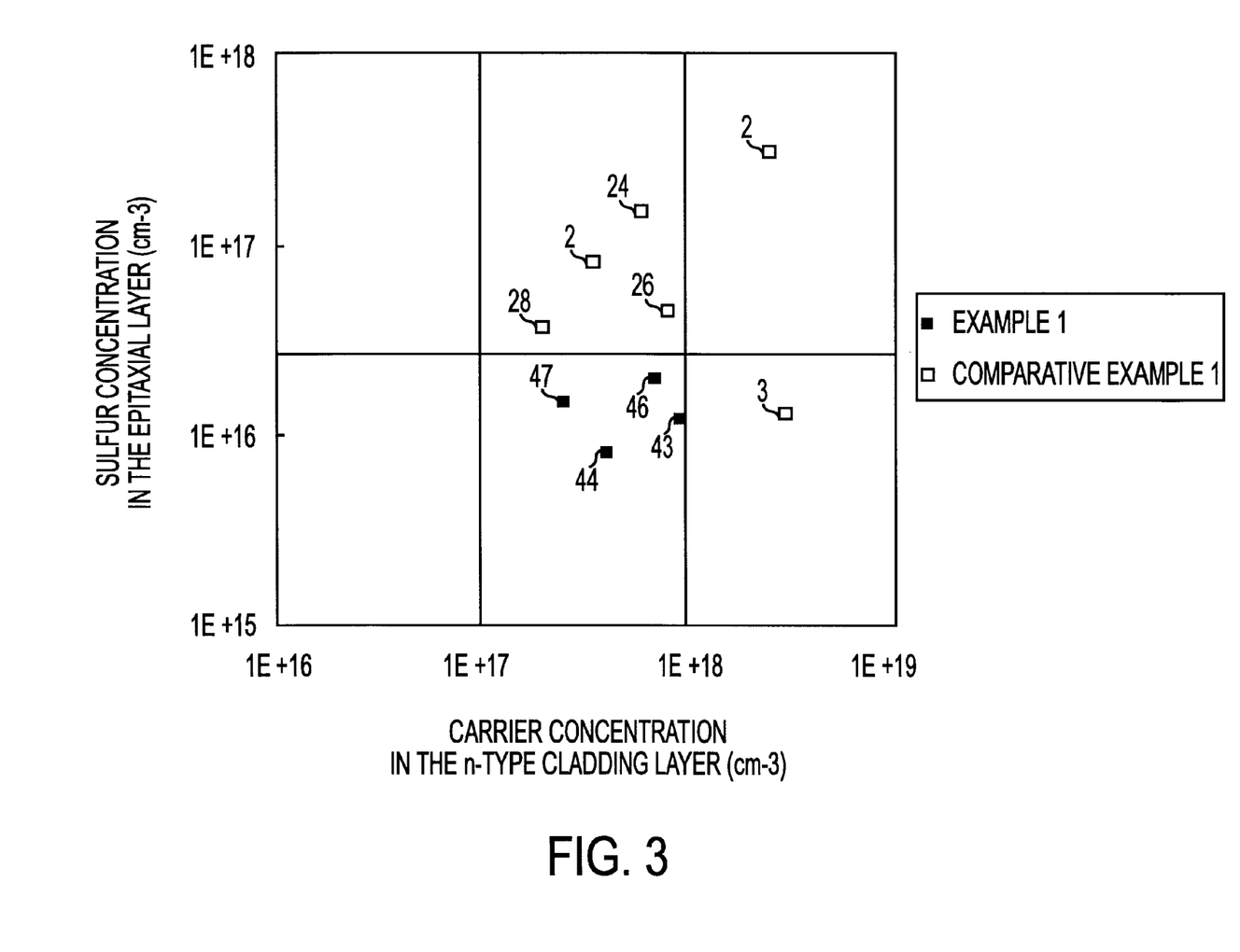
FIG. 3 shows the relationship between sulfur concentration and carrier concentration in an n-type cladding layer, as well as intensity of emitted light of an LED at each data point.

FIG. 3 shows results of measuring sulfur concentration and carrier concentration in the n-type cladding layer and emitted-light intensity of the LED fabricated in Example 1 and Comparative Examples 1 to 3. As is clear from FIG. 3, an LED exhibiting high relative intensity of emitted light can be fabricated when carrier concentration of the n-cladding layer is controlled to $1 \times 10^{17}$ cm$^{-3}$ to $1 \times 10^{18}$ cm$^{-3}$ and sulfur concentration of the n-cladding layer is controlled to $3 \times 10^{16}$ cm$^{-3}$ or less.

Figure 4:
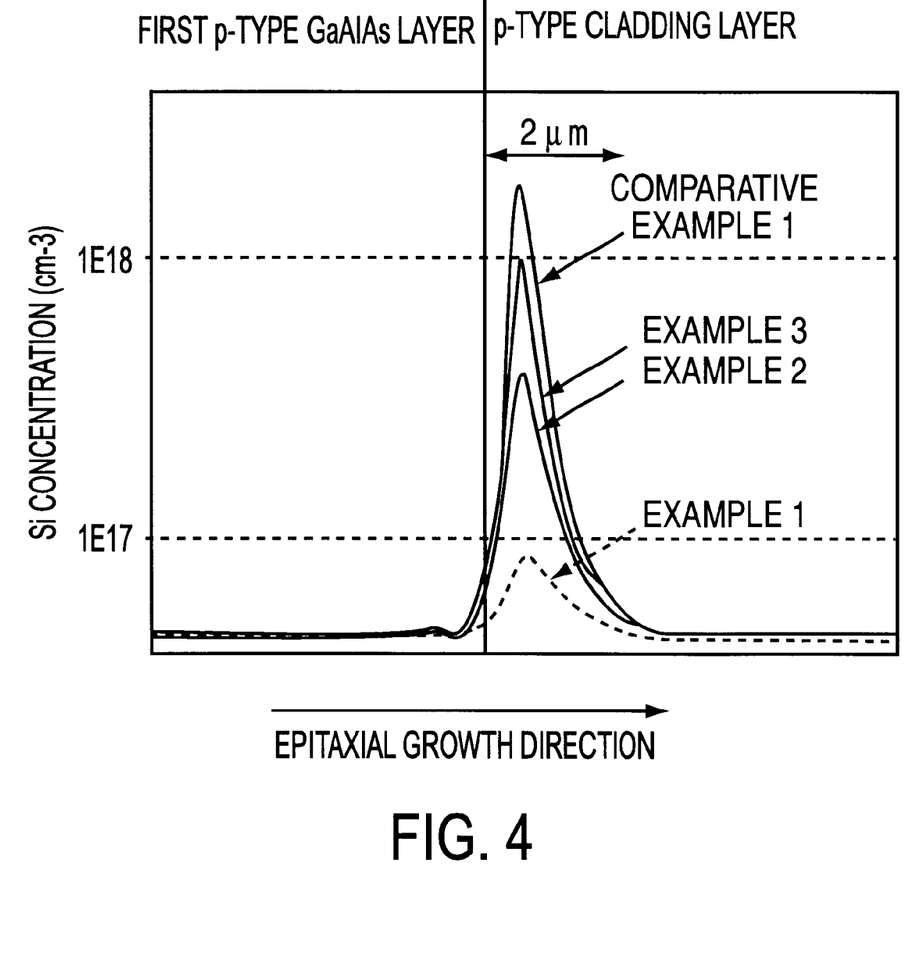
FIG. 4 shows Si concentration profiles in a portion in the vicinity of the interface between a first p-type GaAlAs layer and a p-type cladding layer.

FIG. 4 shows results of measuring Si concentration of a portion in the vicinity of the interface between the first p-type GaAlAs layer and the p-type cladding layer for samples of Examples 1 to 3 and Comparative Example 1. As is clear from FIG. 4, a concentration peak appears in an area in the p-type cladding layer within 2 µm of the interface between the p-type GaAlAs cladding layer and the p-type cladding layer. The concentration profiles of Examples 1 and 2 indicate that the height of the silicon concentration peak is greater at a growth rate of an initially grown portion of 0.5° C./minute than at a growth rate of 0.2° C./minute and that the height of the silicon concentration peak is further elevated at a growth rate of 1.0° C./minute. The concentration profiles of Example 3 and Comparative Example 1 indicate that employment of the aforementioned graphite-made crucible caps elevates the height of the silicon concentration peak as compared with the case of employment of glassy carbon-made crucible caps, even when growth rate is identical.

Figure 5:
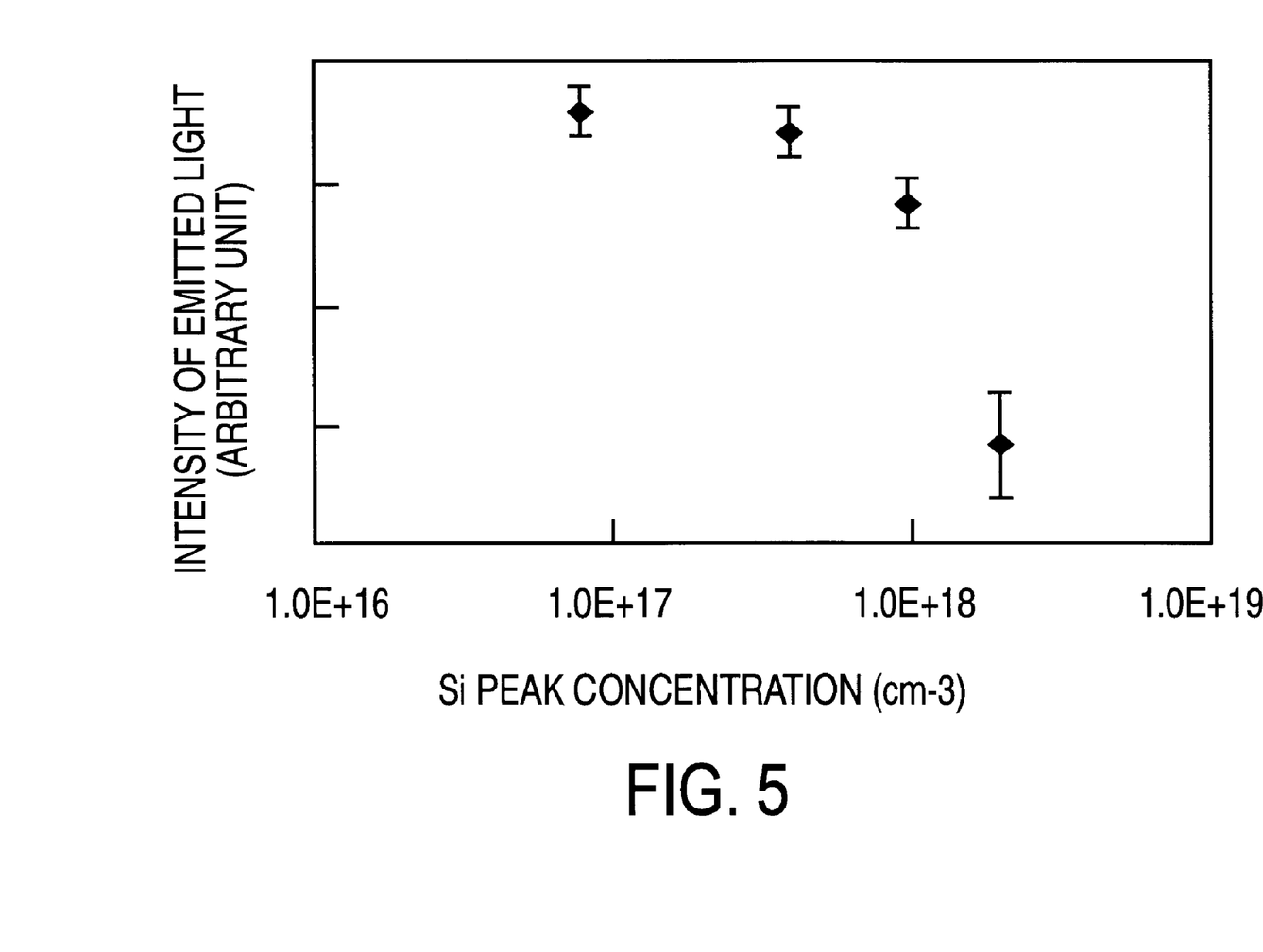
FIG. 5 shows the relationship between peak silicon concentration and intensity of emitted light of an LED.

FIG. 5 shows the relationship between intensity of emitted light of an LED and peak silicon concentration of the aforementioned portion in the vicinity of the interface. As is clear from FIG. 5, when the peak silicon concentration of the aforementioned portion in the vicinity of the interface is in excess of $1 \times 10^{18}$ atoms/cm$^3$, the intensity of light emitted from the LED decreases and variation in intensity increases. When the peak silicon concentration is controlled to less than $1 \times 10^{18}$ atoms/cm$^3$, preferably $4 \times 10^{17}$ atoms/cm$^3$ or less, particularly preferably less than $1 \times 10^{17}$ atoms/cm$^3$, a high intensity with low variation can be attained.

As described above, lowering the growth rate and employment of glassy-carbon-made crucible caps are effective for lowering silicon concentration at a portion in the vicinity of the interface. However, since a low growth rate prolongs the time for performing epitaxial growth to disadvantageously lower production efficiency, the growth rate is effectively lowered only at a portion in the vicinity of the interface.

Figure 6:
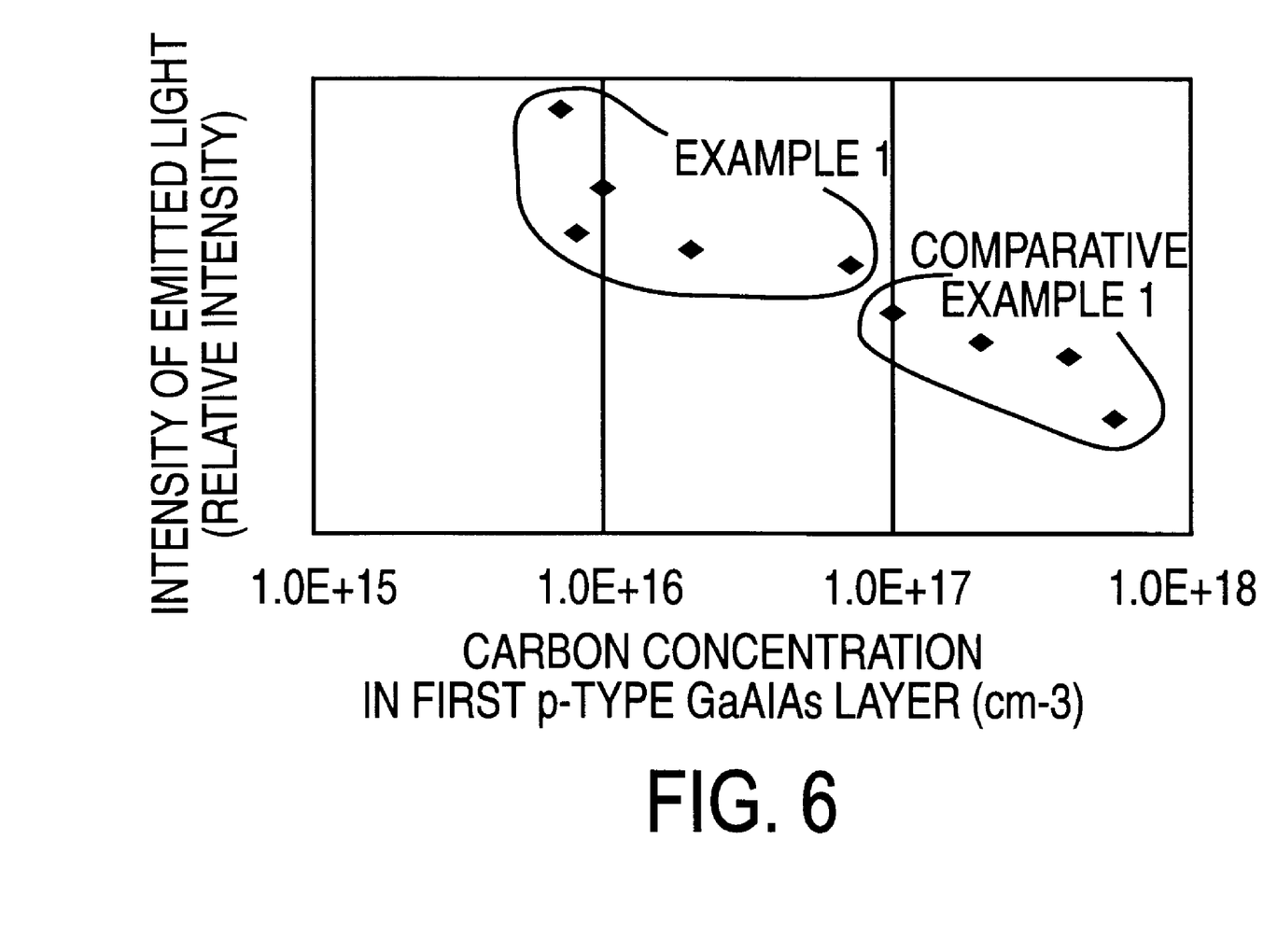
FIG. 6 shows the relationship between carbon concentration in the first p-type GaAlAs layer and intensity of emitted light of an LED.
Figure 7:
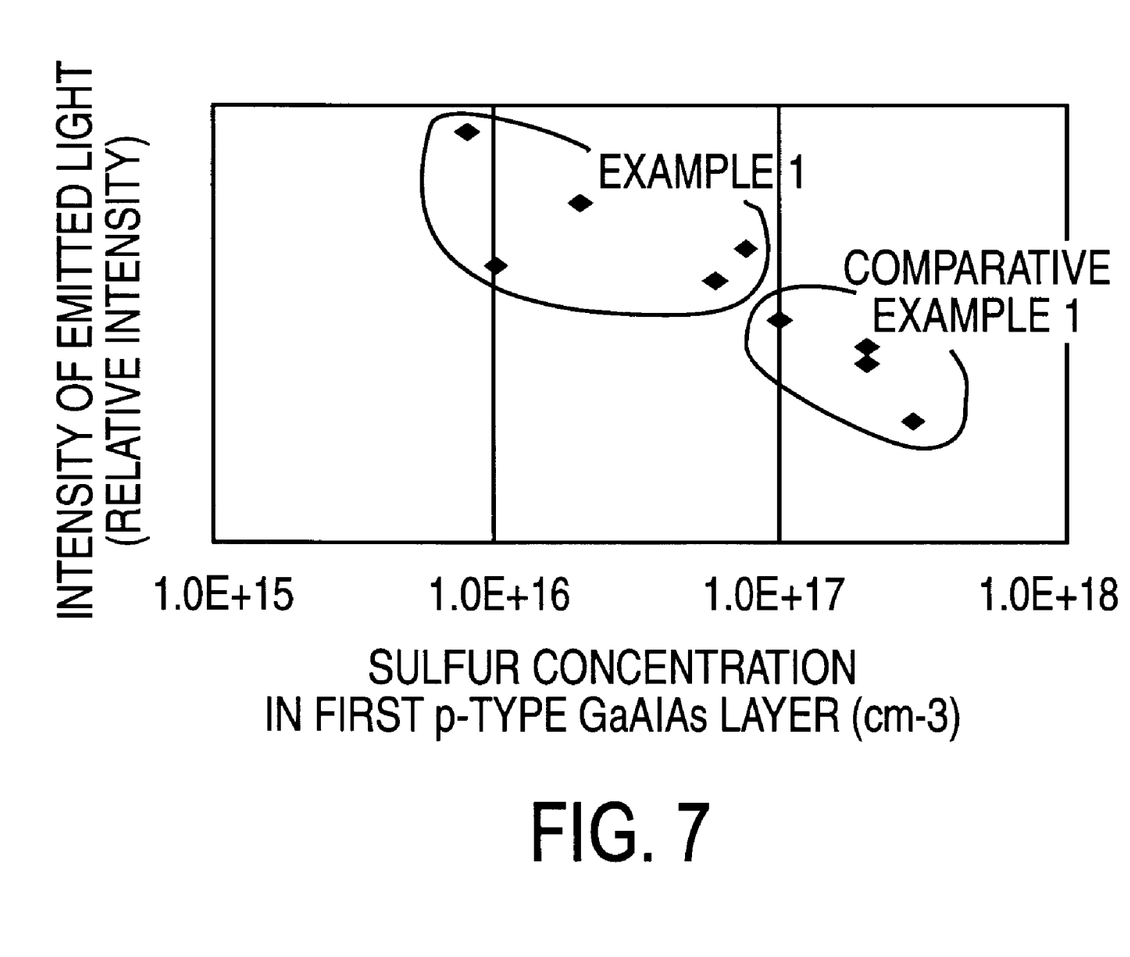
FIG. 7 shows the relationship between sulfur concentration in the first p-type GaAlAs layer and intensity of emitted light of an LED.
Figure 8:
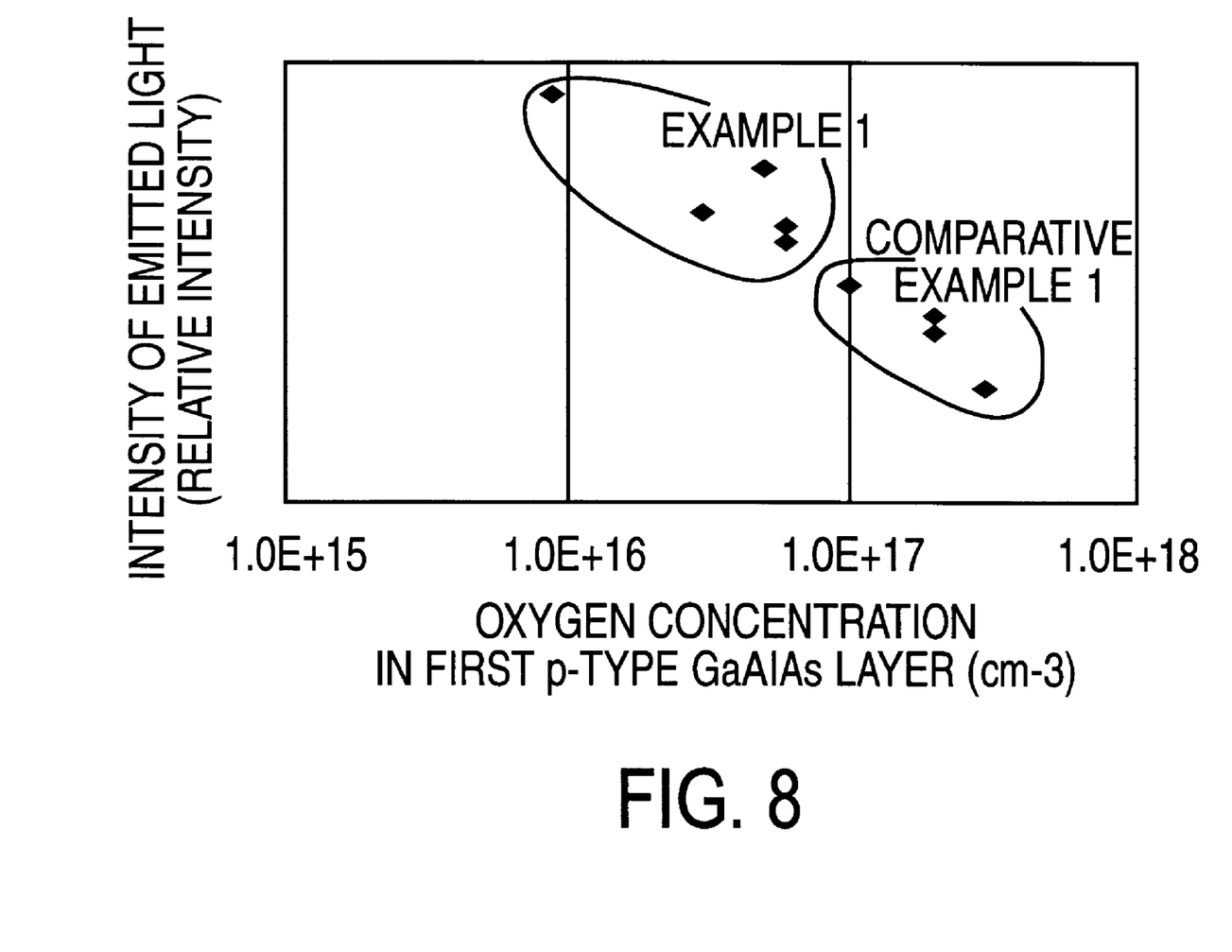
FIG. 8 shows the relationship between oxygen concentration in the first p-type GaAlAs layer and intensity of emitted light of an LED.

FIGS. 6, 7, and 8 show the relationships between impurity concentration (i.e., carbon (FIG. 6), sulfur (FIG. 7), oxygen (FIG. 8)) in the first p-type GaAlAs layer and intensity of emitted light of the LED for samples of Example 1 and Comparative Example 1. As is clear from FIG. 6, carbon concentration in the first p-type GaAlAs layer is controlled to less than $1 \times 10^{17}$ atoms/cm$^3$, thereby attaining a relative LED intensity of a practically employed level. Similarly, as is clear from FIGS. 7 and 8, impurity (sulfur or oxygen) concentration in the first p-type GaAlAs layer is controlled to less than $1 \times 10^{17}$ atoms/cm$^3$, thereby attaining a relative LED intensity of a practically employed level. As described above, the substrate-holding cavity 7 and inner surfaces of crucibles 10 to 13 are coated with glassy carbon, thereby reducing the amounts of carbon, sulfur or oxygen in epitaxial layers and enhancing LED intensity.

Figure 9:
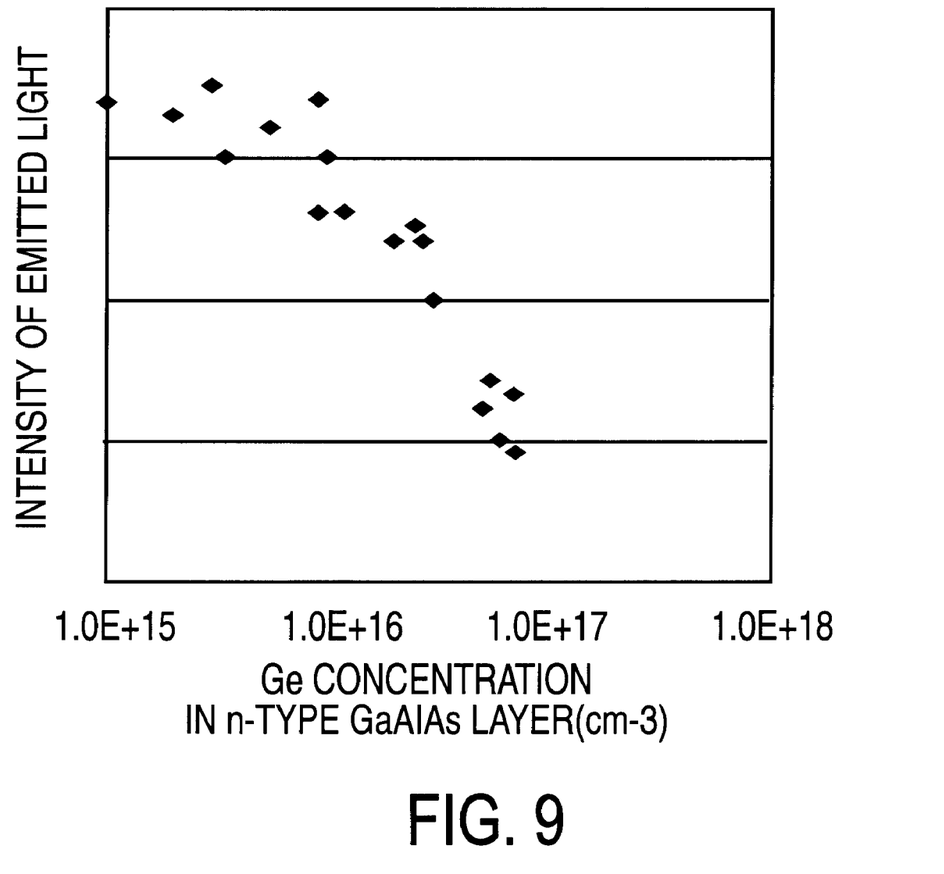
FIG. 9 shows the relationship between Ge concentration in an n-type cladding layer and intensity of emitted light of an LED.

FIG. 9 shows the relationship between Ge concentration in the n-type cladding layer and intensity of emitted light of light-emitting devices fabricated in Example 1 and Comparative Examples 1 to 3.

As shown in FIG. 9, when Ge concentration in the n-type cladding layer is $1 \times 10^{16}$ cm$^{-3}$ or less, emitted-light intensity is almost constant, whereas when the concentration is in excess of $1 \times 10^{16}$ cm$^{-3}$, the intensity begins to decrease. Finally, when the concentration is higher than $3 \times 10^{16}$ cm$^{-3}$, the intensity decreases drastically. Therefore, high emitted-light intensity can be attained by controlling Ge concentration in the n-type cladding layer to $3 \times 10^{16}$ cm$^{-3}$ or less, preferably $1 \times 10^{16}$ cm$^{-3}$ or less.

INDUSTRIAL APPLICABILITY

The present invention provides a GaAlAs epitaxial wafer for fabricating infrared LEDs which can produce high-intensity LEDs, wherein carrier concentration in the n-type cladding layer, sulfur concentration therein, and thickness thereof are controlled to $1 \times 10^{17}$ cm$^{-3}$ to $1 \times 10^{18}$ cm$^{-3}$, $3 \times 10^{16}$ atoms/cm$^3$ or less, and 20–50 μm, respectively.

Particularly, a high emitted-light intensity without variation can be attained when the maximum silicon concentration of an initially grown portion in the p-type cladding layer; concentration of carbon, sulfur, or oxygen in the first p-type layer; and Ge concentration in the n-type GaAlAs layer are controlled to less than $1 \times 10^{18}$ atoms/cm$^3$, less than $1 \times 10^{17}$ atoms/cm$^3$; and $3 \times 10^{16}$ atoms/cm$^3$ or less, respectively.

In the epitaxial wafer of the structure, the thickness of the p-type cladding layer is controlled to 50–80 μm, thereby enhancing emitted-light intensity.

In addition, when carrier concentration in the first p-type GaAlAs layer is controlled to $3 \times 10^{17}$ cm$^{-3}$ to $1 \times 10^{18}$ cm$^{-3}$, epitaxial wafers exhibiting reduced VF and high emitted-light intensity can be provided.

Particularly, in the present invention, the rate for cooling the atmosphere at an initial stage of forming the p-type cladding layer is set to be lower than that at a later stage, thereby enhancing productivity and lowering silicon concentration in a portion in the vicinity of the interface between the p-type cladding layer and the first p-type layer. Thus, there can be produced an epitaxial wafer for fabricating an infrared LED exhibiting high emitted-light intensity with small variation.

The epitaxial wafer for fabricating an infrared LED according to the present invention enables enhancement of emitted-light intensity of an infrared LED, and provides optical communications and spatial transmission devices suitable for transmitting data of large volume over a long distance.

What is claimed is:

1. An epitaxial wafer for fabricating an infrared light-emitting device, which wafer is produced by sequentially forming on a p-type GaAs single-crystal substrate a first p-type layer ($Ga_{1-X1}Al_{X1}As$, $0.13 \leq X1 \leq 0.40$); a p-type cladding layer ($Ga_{1-X2}Al_{X2}As$, $0.23 \leq X2 \leq 0.46$); a p-type active layer ($Ga_{1-X3}Al_{X3}As$, $0 \leq X3 \leq 0.03$) having an emission wavelength of 850–900 nm; and an n-type cladding layer ($Ga_{1-X4}Al_{X4}As$, $0.13 \leq X4 \leq 0.40$) through liquid-phase epitaxy and removing the p-type GaAs single-crystal substrate, wherein the n-type cladding layer has a carrier concentration of $1 \times 10^{17}$ to $1 \times 10^{18}$ cm$^{-3}$ and a sulfur concentration of $3 \times 10^{16}$ atoms/cm$^3$ or less.

2. An epitaxial wafer for fabricating an infrared light-emitting device as described in claim 1, wherein the n-type cladding layer has a thickness of 20–50 μm.

3. An epitaxial wafer for fabricating an infrared light-emitting device as described in claim 1 or 2, wherein the maximum silicon concentration in the portion of the p-type cladding layer within 2 μm of the interface between the p-type cladding layer and the first p-type layer is less than $1 \times 10^{18}$ atoms/cm$^3$.

4. An epitaxial wafer for fabricating an infrared light-emitting device as described in claim 1 or 2, wherein the concentration of carbon, sulfur, or oxygen in the first p-type layer is less than $1 \times 10^{17}$ atoms/cm$^3$.

5. An epitaxial wafer for fabricating an infrared light-emitting device as described in claim 1 or 2, wherein the p-type cladding layer has a thickness of 50–80 μm.

6. An epitaxial wafer for fabricating an infrared light-emitting device as described in claim 1 or 2, wherein the first p-type layer has a carrier concentration of $3 \times 10^{17}$ to $1 \times 10^{18}$ cm$^{-3}$.

7. An epitaxial wafer for fabricating an infrared light-emitting device as described in claim 1 or 2, wherein the p-type active layer contains germanium as a predominant impurity and the n-type cladding layer contains germanium at a concentration of $3 \times 10^{18}$ cm$^{-3}$ or less.

8. A light-emitting device fabricated by use of an epitaxial wafer for fabricating an infrared light-emitting device as recited in claim 1 or 2.

9. An optical communications and spatial transmission apparatus employing a light-emitting device as recited in claim 8.

* * * * *